(12) United States Patent
Shibata et al.

(10) Patent No.: US 12,463,191 B2
(45) Date of Patent: Nov. 4, 2025

(54) METHOD FOR MANUFACTURING ELECTRONIC COMPONENT DEVICE AND ELECTRONIC COMPONENT DEVICE

(71) Applicant: Showa Denko Materials Co., Ltd., Tokyo (JP)

(72) Inventors: Tomoaki Shibata, Tokyo (JP); Tsuyoshi Ogawa, Tokyo (JP); Satoshi Yoneda, Tokyo (JP); Xinrong Li, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 439 days.

(21) Appl. No.: 17/612,321

(22) PCT Filed: May 21, 2020

(86) PCT No.: PCT/JP2020/020132
§ 371 (c)(1),
(2) Date: Nov. 18, 2021

(87) PCT Pub. No.: WO2021/038986
PCT Pub. Date: Mar. 4, 2021

(65) Prior Publication Data
US 2022/0246597 A1 Aug. 4, 2022

(30) Foreign Application Priority Data
Aug. 29, 2019 (JP) ................. 2019-156617

(51) Int. Cl.
*H01L 25/00* (2006.01)
*H01L 23/00* (2006.01)
*H01L 23/02* (2006.01)
*H01L 23/31* (2006.01)

(52) U.S. Cl.
CPC ............ *H01L 25/50* (2013.01); *H01L 23/02* (2013.01); *H01L 23/31* (2013.01); *H01L 24/11* (2013.01); *H01L 24/12* (2013.01)

(58) Field of Classification Search
CPC ......... H01L 25/50; H01L 23/02; H01L 23/31; H01L 24/11; H01L 24/12
USPC ....................................... 257/737
See application file for complete search history.

(56) References Cited

U.S. PATENT DOCUMENTS

| 6,479,886 B1 * | 11/2002 | Pollock ............... H01L 23/552 257/659 |
| 9,892,990 B1 * | 2/2018 | Galloway ............. H01L 23/10 |
| 10,103,106 B2 * | 10/2018 | Dang ................ H01L 23/49894 |
| 2009/0289335 A1 * | 11/2009 | Camacho ......... H01L 23/49551 257/659 |

(Continued)

*Primary Examiner* — Mohammad M Hoque
(74) *Attorney, Agent, or Firm* — FITCH, EVEN, TABIN & FLANNERY, LLP

(57) ABSTRACT

Disclosed is a method for manufacturing an electronic component device, including: preparing a sealing structure having a sealing layer having two opposing main surfaces, an electronic component, and a connection portion, the connection portion being exposed on a circuit surface that is one main surface of the sealing layer; preparing a rewiring structure having a rewiring portion having two opposing main surfaces, and a plurality of bumps; and bonding the sealing structure and the rewiring structure in a direction that the circuit surface and the plurality of bumps face each other, with an insulating layer intervening.

10 Claims, 5 Drawing Sheets

(56) References Cited

U.S. PATENT DOCUMENTS

| | | | |
|---|---|---|---|
| 2010/0172116 A1* | 7/2010 | Yorita | H01L 21/565 |
| | | | 29/830 |
| 2011/0127654 A1* | 6/2011 | Weng | H01L 24/19 |
| | | | 257/E23.114 |
| 2011/0298110 A1* | 12/2011 | Pagaila | H01L 24/19 |
| | | | 257/E23.101 |
| 2013/0087895 A1* | 4/2013 | Upadhyayula | H01L 23/552 |
| | | | 257/659 |
| 2014/0319681 A1* | 10/2014 | Maohua | H01L 23/3736 |
| | | | 257/738 |
| 2016/0276307 A1* | 9/2016 | Lin | H01L 23/562 |
| 2016/0351509 A1* | 12/2016 | Dang | H01L 21/268 |
| 2017/0098634 A1* | 4/2017 | Kumar | H01L 25/50 |
| 2018/0138101 A1* | 5/2018 | Yu | H01L 23/481 |
| 2018/0158783 A1* | 6/2018 | Lin | H01L 24/97 |
| 2018/0277489 A1* | 9/2018 | Han | H01L 24/82 |
| 2018/0301420 A1* | 10/2018 | Kim | H01L 21/4885 |
| 2018/0323170 A1* | 11/2018 | Kim | H01L 21/4853 |
| 2018/0337135 A1* | 11/2018 | Yoshihiro | H01L 25/16 |
| 2018/0350725 A1* | 12/2018 | Tuominen | H01L 23/49822 |
| 2018/0366407 A1 | 12/2018 | Ooi et al. | |
| 2019/0006288 A1* | 1/2019 | Wang | H01L 21/6835 |
| 2019/0148304 A1* | 5/2019 | Gavagnin | H01L 21/4853 |
| | | | 257/773 |
| 2020/0020643 A1* | 1/2020 | Yu | H01L 23/49827 |
| 2020/0126879 A1* | 4/2020 | Schober | H01L 23/13 |
| 2020/0350260 A1* | 11/2020 | Patil | H01L 23/49822 |
| 2021/0035917 A1* | 2/2021 | Fay | H01Q 1/2283 |
| 2023/0060618 A1* | 3/2023 | Lee | H01L 21/6835 |
| 2023/0128938 A1* | 4/2023 | Zhao | H05K 3/4688 |
| | | | 361/761 |

* cited by examiner (a)

(b)

(c)

(d)

(e)

(f)

METHOD FOR MANUFACTURING ELECTRONIC COMPONENT DEVICE AND ELECTRONIC COMPONENT DEVICE

CROSS-REFERENCE TO RELATED APPLICATIONS

This application is a U.S. national phase application filed under 35 U.S.C. § 371 of International Application No. PCT/JP2020/020132, filed May 21, 2020, designating the United States, which claims priority from Japanese Application No. 2019-156617, filed Aug. 29, 2019, which are hereby incorporated herein by reference in their entirety.

TECHNICAL FIELD

The present invention relates to a method for manufacturing an electronic component device, and an electronic component device.

BACKGROUND ART

As a method for manufacturing a semiconductor package having a plurality of semiconductor chips, a method is known in which a semiconductor chip is arranged on a carrier substrate, the semiconductor chip is sealed, and then, the carrier substrate is peeled off (for example, Patent Literature 1). In such a method, rewiring connected to the semiconductor chip is formed subsequent to the peeling of the carrier substrate.

CITATION LIST

Patent Literature

Patent Literature 1: U.S. Unexamined Patent Publication No. 2018/0366407

SUMMARY OF INVENTION

Technical Problem

One aspect of the present invention provides a method for enabling an electronic component device to be efficiently manufactured while suppressing a decrease in a yield ratio even in the case of manufacturing an electronic component device including fine rewiring.

Solution to Problem

One aspect of the present invention relates to a method for manufacturing an electronic component device, the method including: preparing a sealing structure comprising a sealing layer having two opposing main surfaces, an electronic component sealed in the sealing layer, and a connection portion connected to the electronic component, the connection portion being exposed on a circuit surface that is one main surface of the sealing layer; preparing a rewiring structure comprising a rewiring portion having two opposing main surfaces, and a plurality of bumps provided on one main surface of the rewiring portion, the rewiring portion comprising rewiring connected to the plurality of bumps, and an insulating layer; bonding the sealing structure and the rewiring structure in a direction that the circuit surface and the plurality of bumps face each other, with an insulating adhesive layer intervening, such that the connection portion and at least a part of the plurality of bumps are connected, thereby forming a connected body comprising the sealing structure and the rewiring structure, the rewiring portion of the rewiring structure connected to the sealing structure comprising a protruding portion protruding to an outside from an end portion of the sealing structure; and forming an external sealing layer sealing the sealing structure on a surface of the connected body on the sealing structure side, the external sealing layer extending to a position on the protruding portion from a position on the main surface of the sealing structure on a side opposite to the rewiring structure.

Another aspect of the present invention relates to an electronic component device, comprising: the connected body comprising the sealing structure, the rewiring structure, and the insulating adhesive layer; and the external sealing layer sealing the sealing structure. The sealing structure and the rewiring structure are bonded in the direction in which the circuit surface and the bump face each other, with the insulating adhesive layer intervening, such that the connection portion and at least a part of the plurality of bumps are connected. The rewiring portion comprises the protruding portion protruding to the outside from the end portion of the sealing structure. The external sealing layer is provided on the surface of the connected body on the sealing structure side. The rewiring portion extends to the position on the protruding portion from the position on the main surface of the sealing structure on a side opposite to the rewiring structure.

Advantageous Effects of Invention

In a method according to an aspect of the present invention, a sealing structure having an electronic component sealed in a sealing layer, and a rewiring structure having rewiring are separately prepared. Accordingly, fine rewiring is easily formed with a high accuracy, compared to the case of forming the rewiring on the structure including the electronic component sealed in the sealing layer while ensuring the connection with respect to the electronic component. In addition, an electronic component device can be manufactured by selecting non-defective sealing structure and rewiring structure, which is also excellent in a yield ratio. Further, a protruding portion is less likely to be damaged, and the electronic component device can be more easily handled, by providing an external sealing layer.

DESCRIPTION OF EMBODIMENTS

Figure 1:
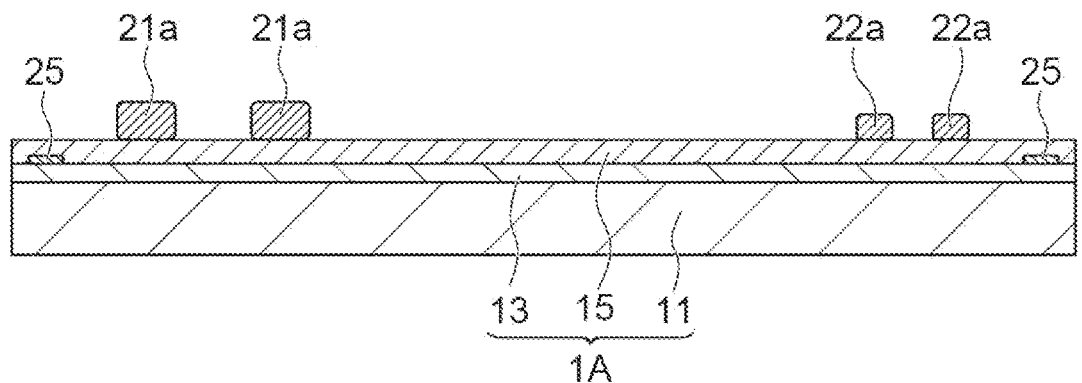
FIG. 1 is a process drawing illustrating an embodiment of a method for manufacturing an electronic component device.
Figure 1:
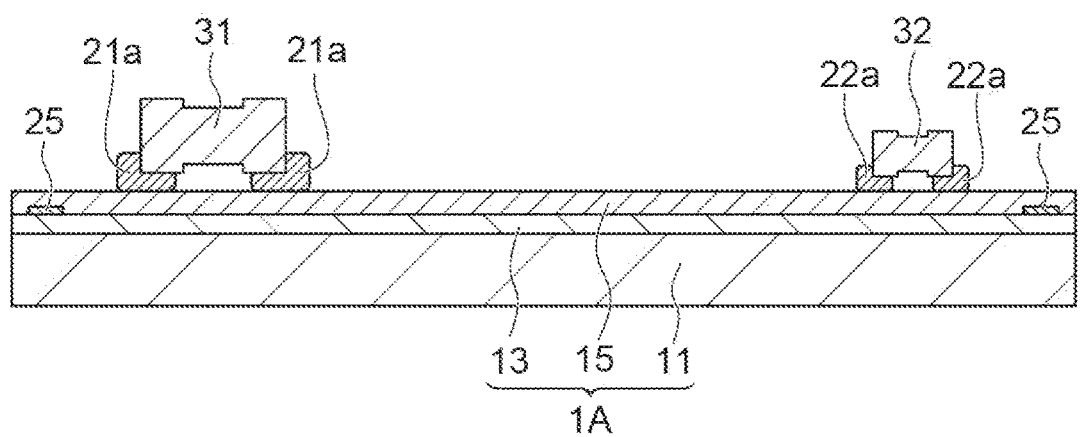
Figure 1:
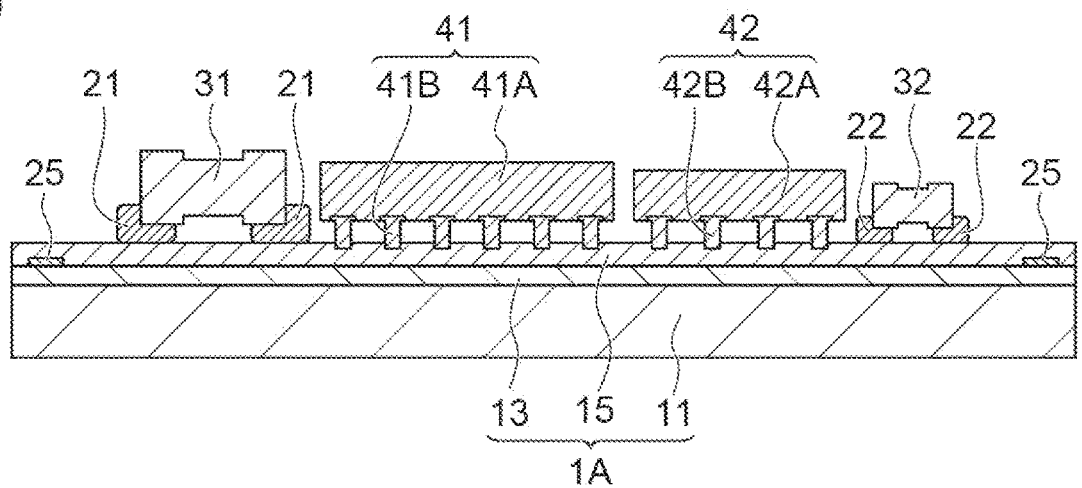

Hereinafter, several embodiments of the present invention will be described in detail. However, the present invention is not limited to the following embodiments.

FIG. 1, FIG. 2, FIG. 3, FIG. 4, and FIG. 5 are process drawings illustrating an embodiment of a method for manufacturing an electronic component device provided with a plurality of electronic components including an IC chip and a chip type passive component. The method exemplified in FIGS. 1 to 5 mainly includes a step of preparing a sealing structure 50 having a sealing layer 5 with two opposing main surfaces, electronic components (IC chips 41A and 42A and chip type passive components 31 and 32) sealed in the sealing layer 5, and connection portions (bumps 41B and 42B and conductive patterns 21 and 22) connected to the electronic components, in which the connection portion (the bumps 41B and 42B and the conductive patterns 21 and 22) is exposed on a flat circuit surface CS that is one main surface of the sealing layer 5 (FIGS. 1 and 2), a step of preparing a rewiring structure 60 having a rewiring portion 6 with two opposing main surfaces, and a plurality of bumps 63 provided on one main surface 6S of the rewiring portion 6, in which the rewiring structure 60 is fixed onto a carrier base material 1B (FIG. 3), a step of connecting the sealing structure 50 and the rewiring structure 60 by bonding the sealing structure 50 and the rewiring structure 60 in a direction in which the circuit surface CS and the bump 63 face each other, with an insulating adhesive layer intervening, in which the rewiring portion 6 of the rewiring structure 60 connected to the sealing structure 50 has a protruding portion 6E protruding to the outside from an end portion 50E of the sealing structure 50 (FIGS. 4(i) and 4(j)), a step of forming a conductive shield film 23 covering a portion not in contact with the insulating adhesive layer 70 on the outer surface of the sealing structure 50 connected to the rewiring structure 60 (FIG. 4(k)), a step of forming an external sealing layer 8 sealing the sealing structure 50 on the surface of the connected body 80 on the sealing structure 50 side (FIG. 5(l)), and a step of peeling off the carrier base material 1B from the rewiring structure 60 connected to the sealing structure 50 (FIG. 5(m)).

Figure 2:
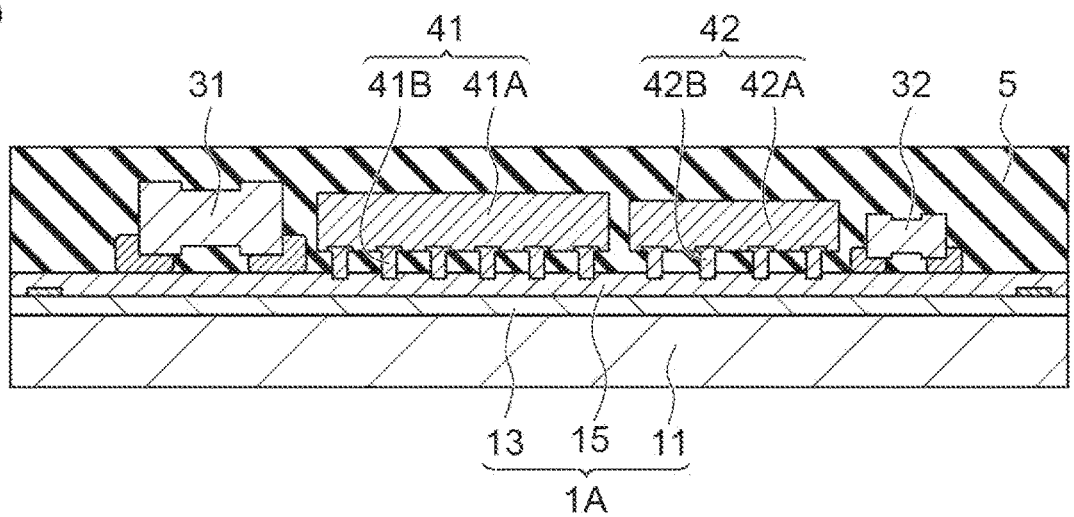
FIG. 2 is a process drawing illustrating an embodiment of a method for manufacturing an electronic component device.
Figure 2:
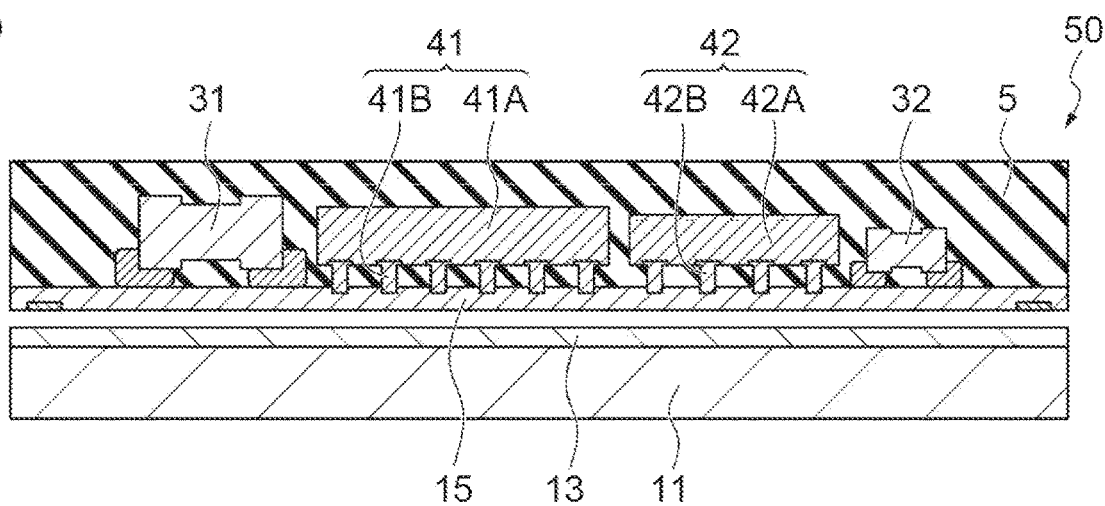
Figure 2:
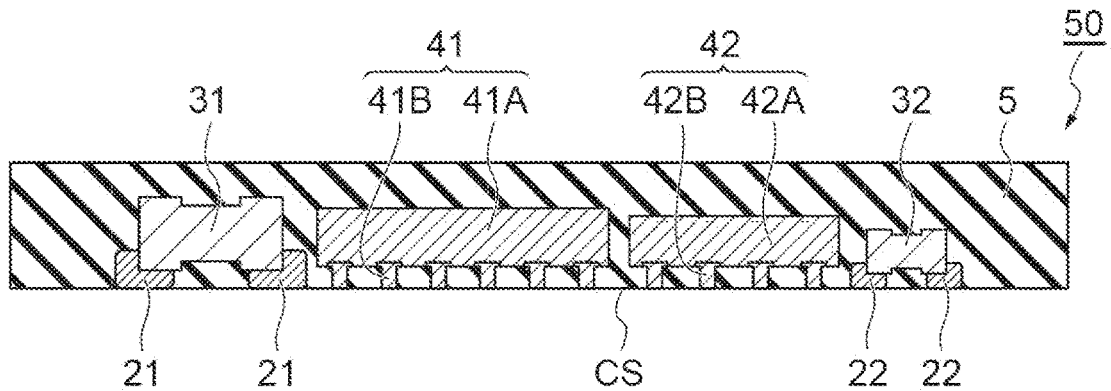

FIGS. 1 and 2 illustrate an example of the step of preparing the sealing structure 50. In this example, first, a composite carrier base material 1A illustrated in FIG. 1(a) is prepared. The composite carrier base material 1A has a support 11, a temporary fixing material layer 13, and a curable adhesive layer 15. The temporary fixing material layer 13 and/or the adhesive layer 15 are laminated on the support 11, in this order.

The support 11 may have strength and rigidity to the extent that the electronic component can be supported, and the material thereof is not particularly limited. For example, the support 11 may be a silicon wafer, a glass plate, or a stainless steel plate. The thickness of the support 11 is not particularly limited, and for example, may be 200 to 2000 μm. An alignment mark 25 for positioning the electronic component may be provided on the surface of the temporary fixing material layer 13 on the adhesive layer 15 side or the surface of the support 11 on the temporary fixing material layer 13 side. The alignment mark 25 can be formed by using an arbitrary material such as a metal and a resin. In a case where the alignment mark 25 is provided, the temporary fixing material layer 13 and the adhesive layer 15 may be transparent to the extent that the alignment mark 25 is visible.

The adhesive layer 15 contains a curable adhesive that is irreversibly adhesively joined to an adherend after curing. The thickness of the adhesive layer 15, for example, may be 1 to 50 μm. The curable adhesive for forming the adhesive layer 15 may be selected from known adhesive known as an adhesive for a semiconductor (for example, refer to International Publication WO 2017/073630 and Japanese Patent No. 3117971).

The curable adhesive for forming the adhesive layer 15, for example, contains a thermosetting resin and a curing agent thereof. The thermosetting resin is a compound that is capable of forming a cross-linked structure by heating. The thermosetting resin may have a molecular weight of 10000 or less. Examples of the thermosetting resin include an epoxy resin and an acrylic resin. The curing agent is a compound that forms a cross-linked structure along with the thermosetting resin by a reaction with the thermosetting resin. Examples of the curing agent include a phenolic resin-based curing agent, an acid anhydride-based curing agent, an amine-based curing agent, an imidazole-based curing agent, a phosphine-based curing agent, an azo compound, and an organic peroxide. The curable adhesive may further contain other components such as a thermoplastic resin and a filler (for example, silica).

The temporary fixing material layer 13 has peeling properties to the extent that the temporary fixing material layer 13 can be peeled off from the adhesive layer 15 after curing. The thickness of the temporary fixing material layer 13, for example, may be 1 to 100 μm. A material for forming the temporary fixing material layer 13 can be selected from materials used for temporary fixing or temporary adhesive joining in the manufacturing of the electronic component device (for example, refer to International Publication WO 2017/057355).

The composite carrier base material 1A, for example, can be obtained by a method for sequentially forming the temporary fixing material layer 13 and the adhesive layer 15 on the support 11. The film-shaped temporary fixing material layer 13 and the film-shaped adhesive layer 15 (an adhesive film) may be respectively prepared and sequentially laminated by thermal pressure bonding. At this time, the film-shaped temporary fixing material layer 13 and the film-shaped adhesive layer 15 may be laminated under a reduced pressure, from the viewpoint of preventing air bubbles from being involved. Alternatively, a laminate film including the temporary fixing material layer 13 and the adhesive layer 15 may be prepared in advance, and the laminate film may be laminated on the composite carrier base material 1A.

FIG. 1(a) illustrates a step of disposing conductor precursors 21a and 22a for forming the conductive pattern on the adhesive layer 15 of the prepared composite carrier base material 1A. The pattern of the conductor precursors 21a and 22a includes a portion for forming the connection portion to which the passive component described below is connected. The conductor precursors 21a and 22a, for example, can be disposed on the adhesive layer 15 by a printing method such as screen printing.

The conductor precursors 21a and 22a may be cured by heating to form a conductor, and can be arbitrarily selected from conductor precursors generally used by a person skilled in the art. For example, the conductor precursors 21a and 22a may be a curable conductive paste containing conductive particles such as various metal particles or carbon particles. The conductive paste may be a transient liquid phase sintering metal adhesive containing metal particles that can be subjected to transient liquid phase sintering. A plurality of metal particles are fused by the sintering of the transient liquid phase sintering metal adhesive to form a conductor including a metal sintered body. Here, the "transient liquid phase sintering" is also referred to as TLPS, and generally indicates sintering that is performed by the transition of a metal having a low melting point to a liquid phase on a particle interface by heating, and a reactive diffusion of a metal having a high melting point to the formed liquid phase. According to the transient liquid phase sintering, a melting point of the metal sintered body to be formed can be higher than a heating temperature for sintering. In the case of forming conductor properties as the connection portion by heating at a low temperature, there is a tendency that the temporary fixing material layer 13 can be particularly easily peeled off from the adhesive layer 15.

The plurality of metal particles that can be subjected to the transient liquid phase sintering may contain a combination of a metal having a high melting point and a metal having a low melting point. The plurality of metal particles may separately contain first metal particles including metal particles having a high melting point and second metal particles containing a metal having a low melting point, or may contain a metal having a high melting point and a metal having a low melting point in one metal particle.

In a case where the conductor precursor contains the plurality of metal particles that can be subjected to the transient liquid phase sintering, the conductive patterns 21 and 22 can be formed by heating the conductor precursor at a temperature higher than or equal to a liquid phase transition temperature of the plurality of metal particles. The liquid phase transition temperature can be measured in a condition in which the plurality of metal particles are heated to 300° C. from 25° C. at a temperature increase rate of 10° C./minute in a nitrogen stream of 50 ml/minute, by DSC (differential scanning calorimetry). In a case where the metal particles contain a plurality of types of metals, the temperature of a liquid phase transition to be observed at the lowest temperature is considered as the liquid phase transition temperature of the metal particles. For example, a liquid phase transition temperature of a Sn-3.0Ag-0.5Cu alloy is 217° C.

In a case where the plurality of metal particles that can be subjected to the transient liquid phase sintering contain a combination of the first metal particles containing the metal having a high melting point and the second metal particles containing the metal having a low melting point, a mass ratio of the first metal particles to the second metal particles may be 2.0 to 4.0 or 2.2 to 3.5.

The metal particles containing the metal having a high melting point and the metal having a low melting point, for example, can be obtained by forming a layer containing the other metal on the surface of metal particles containing one metal by plating, vapor deposition, or the like. Metal particles containing one metal and metal particles containing the other metal may be composited by collision or the like.

The metal having a high melting point may be at least one type selected from the group consisting of Au, Cu, Ag, Co, and Ni. The metal having a low melting point may be In, Sn, or a combination thereof. Examples of the combination of the metal having a high melting point and the metal having a low melting point include a combination of Au and In, a combination of Cu and Sn, a combination of Ag and Sn, a combination of Co and Sn, and a combination of Ni and Sn.

The combination of Cu and Sn A generates a copper-tin metal compound ($Cu_6Sn_5$) by sintering. Since such a reaction is performed in the vicinity of 250° C., a conductor precursor containing the combination of Cu and Sn can be sintered by heating using a general facility such as a reflow furnace. Sn can be contained in the metal particles as a Sn metal simplex or as an alloy containing Sn. Examples of the alloy containing Sn include a Sn-3.0Ag-0.5Cu alloy. The Sn-3.0Ag-0.5Cu alloy contains 3.0 mass % of Ag and 0.5 mass % of Cu, on the basis of the mass of the alloy.

The content of the metal particles in the conductor precursor may be 80 mass % or more, 85 mass % or more, or 88 mass % or more, and may be 98 mass % or less, on the basis of the mass of the conductor precursor. Here, in a case where the conductor precursor contains a solvent described below, the content is a ratio based on the total mass of components except for the solvent.

An average particle diameter of the metal particles may be 0.5 μm to 80 μm, 1 μm to 50 μm, or 1 μm to 30 μm. Here, the average particle diameter indicates a volume average particle diameter to be measured by a laser diffraction particle size distribution meter (for example, an LS 13 320 type laser scattering diffraction particle size distribution measurement device, manufactured by Beckman Coulter K.K.).

An organic binder in the conductor precursor may contain a thermoplastic resin. The thermoplastic resin may have a softening point lower than the liquid phase transition temperature of the metal particles. The softening point of the thermoplastic resin indicates a value to be measured by a thermo-mechanical analysis method. The softening point to be measured by the thermo-mechanical analysis method is a temperature at a time point when a displacement of 80 μm is observed at the time of compressing a film having a thickness of 100 μm, which is obtained by the film formation of the thermoplastic resin, at a stress of 49 mN in a thickness direction while heating at a temperature increase rate of 10° C./minute. As a measurement device, for example, a thermo-mechanical analysis device (TMA8320, manufactured by Rigaku Corporation, Measurement Probe: a compressive load method standard type) can be used.

The softening point of the thermoplastic resin may be a temperature lower than the liquid phase transition temperature of the metal particles by 5° C. or higher, 10° C. or higher, or 15° C. or higher. The softening point of the thermoplastic resin may be 40° C. or higher, 50° C. or higher, or 60° C. or higher.

The thermoplastic resin, for example, may include at least one type selected from the group consisting of a polyamide resin, a polyamide imide resin, a polyimide resin, and a polyurethane resin. The thermoplastic resin may have a polyoxyalkylene group or a polysiloxane group. The polyoxyalkylene group may be a polyoxyethylene group, a polyoxypropylene group, or a combination thereof.

The thermoplastic resin may be at least one kind of resin having a polyoxyalkylene chain or a polysiloxane chain, selected from the group consisting of a polyamide resin, a polyamide imide resin, a polyimide resin, and a polyurethane resin. For example, the polyoxyalkylene group or the polysiloxane group can be introduced to such a resin by using a diamine compound having a polyoxyalkylene group or a polysiloxane group, or a diol compound having a polyoxyalkylene group or a polysiloxane group, as a monomer.

The content of the thermoplastic resin in the conductor precursor may be 5 to 30 mass %, 6 to 28 mass %, or 8 to 25 mass %, on the basis of the mass of the conductor precursor. Here, in a case where the conductor precursor contains the solvent described below, the content is a ratio based on the total mass of the components except for the solvent.

The organic binder may contain the solvent, or may contain the solvent and the thermoplastic resin. The solvent may be a polar solvent. A boiling point of the solvent may be 200° C. or higher, and may be 300° C. or lower.

Examples of the solvent are capable of including alcohol such as terpineol, stearyl alcohol, tripropylene glycol methyl ether, diethylene glycol, diethylene glycol monoethyl ether (ethoxyethoxyethanol), diethylene glycol monohexyl ether, diethylene glycol monomethyl ether, dipropylene glycol-n-propyl ether, dipropylene glycol-n-butyl ether, tripropylene glycol-n-butyl ether, 1,3-butanediol, 1,4-butanediol, propylene glycol phenyl ether, and 2-(2-butoxyethoxy)ethanol; ester such as tributyl citrate, γ-butyrolactone, diethylene glycol monoethyl ether acetate, dipropylene glycol methyl ether acetate, diethylene glycol monobutyl ether acetate, and glycerin triacetate; ketone such as isophorone; lactam such as N-methyl-2-pyrrolidone; nitrile such as phenyl acetonitrile; 4-methyl-1,3-dioxolan-2-one; and sulfolane. One type of the solvents may be used alone, or two or more types thereof may be used in combination.

The content of the solvent may be 0.1 to 10 mass %, 2 to 7 mass %, or 3 to 5 mass %, on the basis of the mass of the conductor precursor.

The organic binder in the conductor precursor may further contain other components such as a thermosetting resin, rosin, an activator, and a thixotropic agent.

Examples of the thermosetting resin include an epoxy resin, an oxazine resin, a bismaleimide resin, a phenolic resin, an unsaturated polyester resin, and a silicone resin. Examples of the epoxy resin include a bisphenol A type epoxy resin, a bisphenol F type epoxy resin, a bisphenol S type epoxy resin, a phenol novolac type epoxy resin, a cresol novolac type epoxy resin, a naphthalene type epoxy resin, a biphenol type epoxy resin, a biphenyl novolac type epoxy resin, and a cyclic aliphatic epoxy resin.

Examples of the rosin include a dehydroabietic acid, a dihydroabietic acid, a neoabietic acid, a dihydropimaric acid, a pimaric acid, an isopimaric acid, a tetrahydroabietic acid, and a palustric acid.

Examples of the activator include an aminodecanoic acid, a pentane-1,5-dicarboxylic acid, triethanol amine, a diphenyl acetic acid, a sebacic acid, a phthalic acid, a benzoic acid, a dibromosalicylic acid, an anisic acid, an iodosalicylic acid, and a picolinic acid.

Examples of the thixotropic agent include a 12-hydroxystearic acid, 12-hydroxystearic triglyceride, ethylene bis-stearic amide, hexamethylene bisoleic amide, and N,N'-distearyl adipic amide.

The conductor precursor can be obtained by mixing the metal particles and the components configuring the organic binder. A mixing device may be a planetary mixer, a sun-and-planet mixer, a planetary centrifugal stirrer, a mortar machine, a biaxial kneader, or a thin layer shear disperser.

FIG. 1(b) illustrates a step of placing two types of chip type passive components 31 and 32, which are the electronic component, on the conductor precursors 21a and 22a, respectively. The passive components 31 and 32 are selected in accordance with the design of the electronic component device, and for example, may be a resistor, a capacitor, or a combination thereof. The passive components 31 and 32 can be placed on the conductor precursors 21a and 22a by using a general chip mounting machine.

FIG. 1(c) illustrates a step of placing a chip component 41 including the IC chip 41A as the electronic component and a chip component 42 including the IC chip 42A as the electronic component on the adhesive layer 15. The plurality of bumps 41B or 42B are disposed on one main surface side of the IC chip 41A or the IC chip 42A. The chip components 41 and 42 including the IC chips 41A and 42A and the bumps 41B and 42B are a so-called face-down type chip component. The IC chips 41A and 42A are disposed on the adhesive layer 15 in a direction in which the bump 41B or 42B functioning as the connection portion is in contact with the adhesive layer 15. The tip end portion of the bumps 41B and 42B may be partially embedded in the adhesive layer 15. In general, the chip components 41 and 42 are disposed on the adhesive layer 15 in a state where the IC chips 41A and 42A and the adhesive layer 15 are separated from each other. The chip components 41 and 42, for example, can be placed on the adhesive layer 15 by using a chip mounting machine including a stage and a mounting head. By adjusting a condition such as the temperature and the pressure of the stage and the mounting head, a part of the tip end portion of the bumps 41B and 42B can be embedded in the adhesive layer 15.

The order for disposing the passive components 31 and 32 and the chip components 41 and 42 on the adhesive layer 15 can be arbitrarily changed. The passive components 31 and 32 and the chip components 41 and 42 are disposed on the adhesive layer 15, and then, the adhesive layer 15 is cured. The adhesive layer 15 may be a B stage at a time point when the passive components 31 and 32 and the chip components 41 and 42 are disposed on the adhesive layer 15. The adhesive layer 15 is often cured by heating. The passive components 31 and 32 and the IC chips 41A and 42A are solidly fixed to the composite carrier base material 1A by the cured adhesive layer 15. The conductive patterns 21 and 22, which are a cured body of the conductor precursor 21a, are formed by heating the conductor precursors 21a and 22a on which the passive components 31 and 32 are placed, along with the curing of the adhesive layer 15 or after the curing of the adhesive layer 15. Accordingly, the passive components 31 and 32 are fixed in a state where the conductive patterns 21 and 22 as the connection portion are interposed between the passive components 31 and 32 and the adhesive layer 15.

FIG. 2(d) illustrates a step of forming the sealing layer 5 sealing the IC chips 41A and 42A and the passive components 31 and 32 on the adhesive layer 15. The sealing layer 5 is formed to cover the entire IC chips 41A and 42A and the entire passive components 31 and 32 and to fill a gap between the electronic component and the adhesive layer 15. Here, the gap may not be completely filled. The sealing layer 5, for example, can be formed in a metallic mold by a compression or transfer type molding machine. Alternatively, the sealing layer 5 may be formed by using a film-shaped sealing material (for example, refer to International Publication WO 2015/186744). In such a case, the film-shaped sealing material may be laminated under a reduced pressure, from the viewpoint of preventing the air bubbles from being involved.

FIG. 2(e) illustrates a step of obtaining the sealing structure 50 having the adhesive layer 15, the passive components 31 and 32, the IC chips 41A and 42A, and the sealing layer 5 by peeling off the temporary fixing material layer 13 from the adhesive layer 15. The outermost layer of the sealing structure 50 on one main surface side is the adhesive layer 15. The temporary fixing material layer 13, for example, can be peeled off from the adhesive layer 15 by heating, light irradiation, or mechanical peeling. A part of the adhesive layer 15 may be separated and removed along with the temporary fixing material layer 13. As described above, in a case where the sealing layer 5 is formed in a state where a plurality of types of electronic components such as the IC chip and the passive component are temporarily fixed onto the temporary fixing material layer 13, and then, the temporary fixing material layer 13 is peeled off to manufacture a composite electronic component device including the plurality of types of electronic components having different sizes and heights, it is expected that a so-called die shift in which the electronic component is moved from a predetermined position can be suppressed.

The width of the passive components 31 and 32 may be 0.05 to 2 mm, 1 to 2 mm, 0.5 to 1 mm, or 0.1 to 0.5 mm. The width of the IC chips 41A and 42A may be 0.1 to 50 mm. Here, the width indicates the maximum width in a direction parallel to the circuit surface CS. According to the method according to this embodiment, even in a case where the size of the passive component and the IC chip is small, such components can be fixed with sufficient strength.

FIG. 2(f) illustrates a step of forming the circuit surface CS to which the sealing layer 5 and the connection portion (the conductive patterns 21 and 22 and the bumps 41B and 42B) are exposed by grinding the sealing structure 50 from the adhesive layer 15 side to remove the adhesive layer 15. The sealing structure 50 can be ground by using a general grinding device. A part of the sealing layer 5, the conductive patterns 21 and 22, and the bumps 41B and 42B may be ground.

Figure 3:
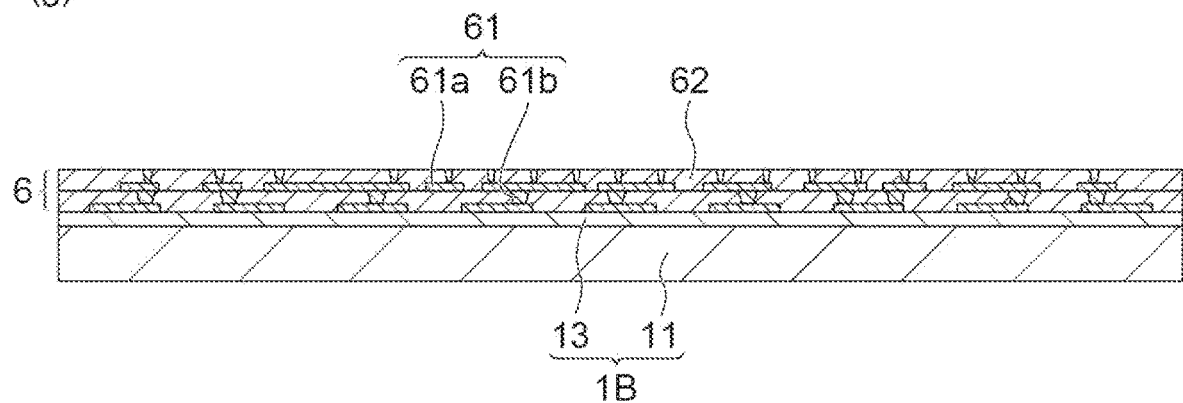
FIG. 3 is a process drawing illustrating an embodiment of a method for manufacturing an electronic component device.
Figure 3:
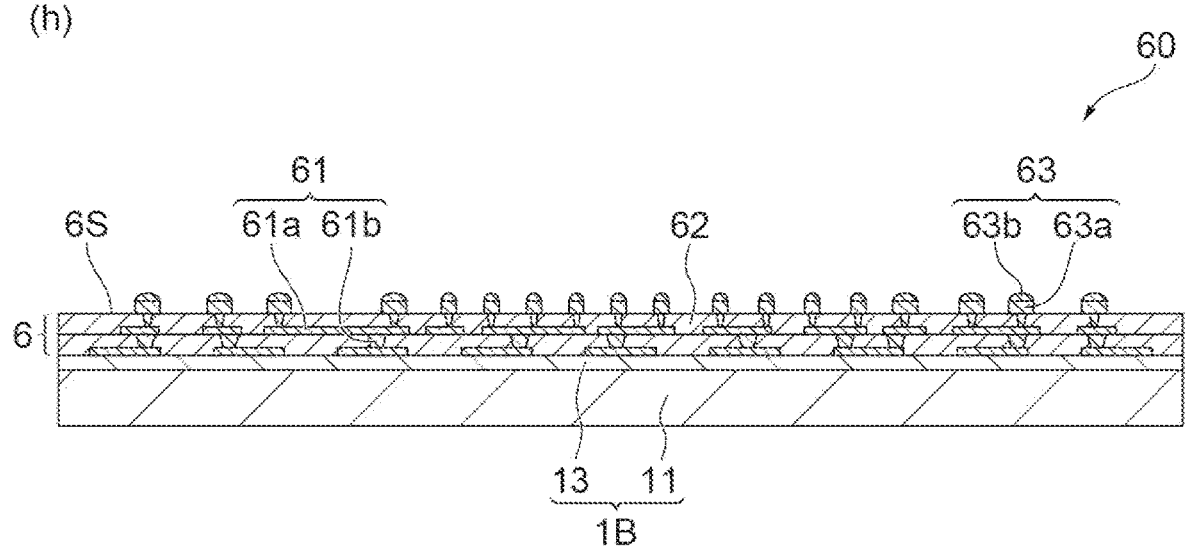

FIG. 3 illustrates an example of the step of preparing the rewiring structure 60. In this example, first, the carrier base material 1B illustrated in FIG. 3(g) is prepared. The carrier base material 1B includes the support 11, and the temporary fixing material layer 13 provided on the support 11. The support 11 and the temporary fixing material layer 13 of the carrier base material 1B are capable of having the same configuration as that of the support 11 and the temporary fixing material layer 13 of the composite carrier base material 1A.

The rewiring portion 6 having two opposing main surfaces is formed on the prepared carrier base material 1B. The rewiring portion 6 includes rewiring 61, and an insulating layer 62 provided between the rewirings 61. The rewiring 61 includes a plurality of wiring layers 61a extending in a direction parallel to the main surface of the rewiring portion 6, and a junction 61b extending in a direction perpendicular to the main surface of the rewiring portion 6. The thickness of each of the wiring layers 61a is not particularly limited, and for example, may be 1 to 30 μm. The rewiring portion 6 can be formed by a general method known to a person skilled in the art. For a method for forming the rewiring portion including the rewiring, for example, Japanese Patent No. 5494766 can be referred to.

Subsequently, as illustrated in FIG. 3(h), the plurality of bumps 63 connected to the rewiring 61 are formed on the main surface 6S of the formed rewiring portion 6 on a side opposite to the carrier base material 1B. The bump 63, for example, has a columnar portion 63a in contact with the rewiring 61, and a semispherical portion 63b provided on the columnar portion 63a. The columnar portion 63a may contain copper, and the semispherical portion 63b may contain lead-free solder (for example, an alloy containing Sn and Ag). The size of the bump 63 is adjusted in a range in which suitable connection with respect to the rewiring 61 can be ensured. For example, the width of the bump 63 may be 5 to 100 μm, and the height of the bump 63 may be 5 to 50 μm. The bump 63 can be formed by a general method.

The prepared rewiring structure 60 may be inspected. The inspection, for example, includes a check for abnormity due to the disconnection or short circuit of the rewiring 61 and the bump 63. According to such inspection, a defective product of the rewiring structure 60 can be excluded before the rewiring structure 60 is connected to the sealing structure 50. As a result thereof, it is possible to decrease a possibility that a normal electronic component is excluded due to a failure in the formation of the rewiring, compared to the case of directly forming the rewiring on the electronic component sealed in the sealing layer. A plurality of rewiring structures 60 may be formed on one carrier base material 1B. In such a case, the rewiring portions 6 (in particular, the insulating layers 62) of the plurality of rewiring structures 60 may be formed continuously with each other.

Figure 4:
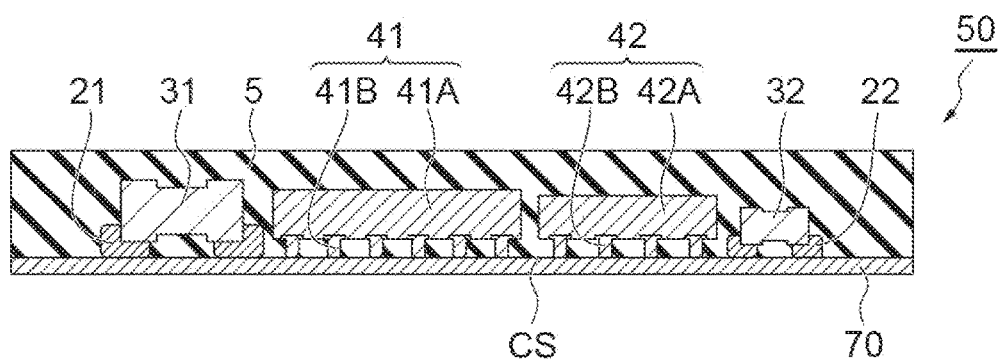
FIG. 4 is a process drawing illustrating an embodiment of a method for manufacturing an electronic component device.
Figure 4:
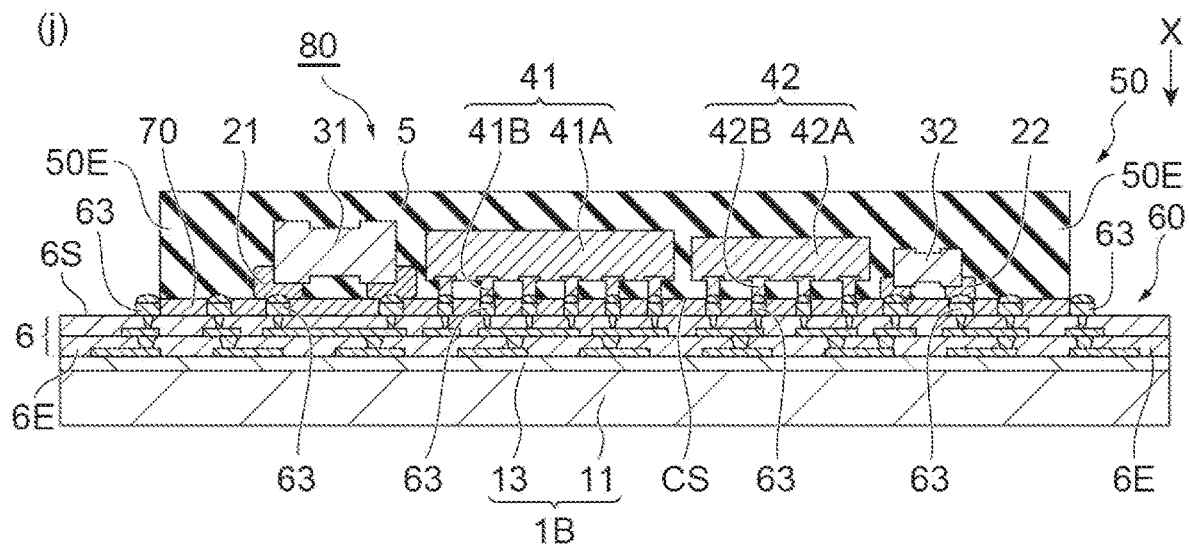
Figure 4:
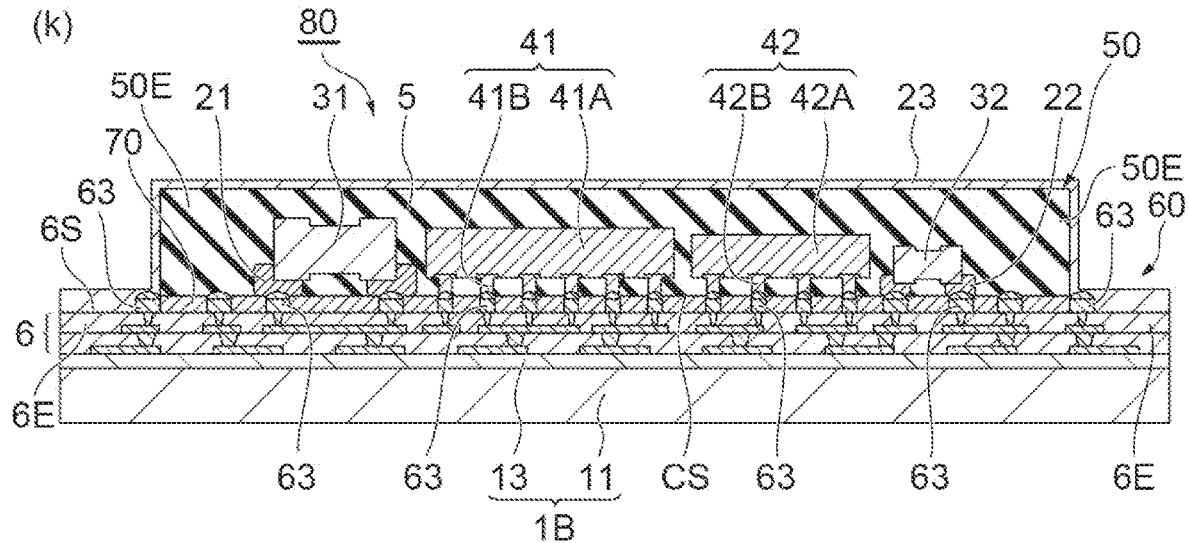

FIG. 4 illustrates an example of the step of forming the connected body 80 by connecting the prepared sealing structure 50 and the prepared rewiring structure 60 with the insulating adhesive layer 70 intervening. In the example illustrated in FIG. 4, first, the insulating adhesive layer 70 is disposed on the circuit surface CS of the sealing structure 50. The insulating adhesive layer 70 can be the same as a semiconductor adhesive that is generally used for adhesively joining a semiconductor chip or the like to a circuit substrate. The insulating adhesive layer 70 may contain the same curable adhesive as that of the adhesive layer 15.

A laminate film including a support film and an insulating adhesive layer provided on the support film may be prepared, and the insulating adhesive layer may be laminated on the circuit surface CS. Examples of a commercially available product of the laminate film that can be used for such a purpose include NCF AK series manufactured by Hitachi Chemical Co., Ltd.

Subsequently, the sealing structure 50 and the rewiring structure 60 are bonded in a direction in which the circuit surface CS and the bump 63 face each other, with the insulating adhesive layer 70 intervening. At this time, the sealing structure 50 and the rewiring structure 60 are positioned such that the connection portion (the conductive patterns 21 and 22 and the bumps 41B and 42B) and a part of the plurality of bumps 63 are connected. In order for the connection between the connection portion (the conductive patterns 21 and 22 and the bumps 41B and 42B) and the bump 63, the curing of the insulating adhesive layer 70, or both thereof, the sealing structure 50 and the rewiring structure 60 may be laminated while heating and pressurizing A heating temperature, for example, may be 250 to 300° C., and a pressure may be 0.5 to 1 MPa. By connecting the connection portion (the conductive patterns 21 and 22 and the bumps 41B and 42B) and a part of the plurality of bumps 63, the sealing structure 50 and the rewiring structure 60 are connected. Herein, the expression of "being connected" may indicate "being electrically connected".

The step of forming the connected body 80 by connecting the sealing structure 50 and the rewiring structure 60 may include temporary pressure bonding in which the sealing structure 50 and the rewiring structure 60 are preliminarily connected by pressurizing the sealing structure 50 and the rewiring structure 60 while heating at a temperature lower than a melting point of the bump 63, such that the connection portion (the conductive patterns 21 and 22 and the bumps 41B and 42B) and at least a part of the plurality of bumps 63 are in contact with each other, and joining the connection portion (the conductive patterns 21 and 22 and the bumps 41B and 42B) and at least a part of the plurality of bumps 63 by heating the sealing structure 50 and the rewiring structure 60 at a temperature higher than the melting point of the bump 63. In such a case, the bump 63 and the connection portion are joined by heating in which the bump 63 is melted using a reflow furnace or the like, after the temporary pressure bonding, to electrically connect the sealing structure 50 and the rewiring structure 60. In the temporary pressure bonding, for example, a heating temperature may be 80 to 130° C., and a pressure may be 0.5 to 1 MPa.

The external sealing layer 8 and/or the shield film 23 may be formed after the connected body 80 in which the sealing structure 50 and the rewiring structure 60 are preliminarily connected is formed by the temporary pressure bonding, and then, the connection portions (the conductive patterns 21 and 22 and the bumps 41B and 42B) and the bump 63 may be joined by heating using a reflow furnace or the like. By performing heating for joining at a high temperature in a state where the external sealing layer 8 is formed, it is possible to prevent an excessive load from being applied to the IC chip. As a result thereof, since the damage of the IC chip can be suppressed, a yield ratio can be further improved.

According to the method including the temporary pressure bonding and the subsequent joining, since a plurality of sealing structures 50 and the rewiring structures 60 can be electrically connected at once, productivity can be improved.

A heating temperature for joining is set to a temperature higher than the melting point of the bump 63. For example, in a case where the bump 63 contains Pb-free solder (an alloy containing Sn and Ag), the heating temperature for joining may be 250 to 300° C. In a case where the bump 63 includes two or more metal layers, the melting point of the bump 63 for determining the heating temperature for joining can be a melting point of the metal layer (in the example of FIG. 3, the semispherical portion 63$b$) in contact with the connection portion. The insulating adhesive layer 70 can be cured in the temporary pressure bonding, in the joining by heating, or between the temporary pressure bonding and the joining by heating.

In the case of applying the temporary pressure bonding and the subsequent joining by heating, a melt viscosity of the insulating adhesive layer 70 may be 7000 Pa·s or less, 6000 Pa·s or less, 5000 Pa·s or less, or 4000 Pa·s or less, at the heating temperature of the temporary pressure bonding. Accordingly, the involvement of voids can be particularly effectively suppressed. The melt viscosity of the insulating adhesive layer 70 may be 1000 Pa·s or more at the heating temperature of the temporary pressure bonding. Accordingly, it is difficult for a part of the insulating adhesive layer 70 to crawl onto the lateral surface of the sealing structure 50. The crawling of the insulating adhesive layer may cause a decrease in productivity due to attachment to a pressure bonding tool, or the like. The melt viscosity of the insulating adhesive layer 70, for example, can be measured by using a rheometer (MCR301, manufactured by Anton Paar Japan K.K.). The melt viscosity can be measured in a condition of a sample thickness of 400 μm, a temperature increase rate of 10° C./minute, and a frequency of 1 Hz, by using a disposable plate having a diameter of 8 mm, and a disposable sample dish.

The insulating adhesive layer 70 may contain a filler. By controlling the viscosity and physical properties after curing with the filler, the generation of voids and the absorption of the moisture can be suppressed between the sealing structure 50 and the rewiring structure 60. The filler may be an inorganic filler, a resin filler, or a combination thereof. The content of the filler may be 30 to 90 mass %, on the basis of the mass of the insulating adhesive layer 70. In a case where the content of the filler is 30 mass % or more, heat dissipation properties of the insulating adhesive layer 70 increase, and the generation of the voids and a moisture absorptivity can be further suppressed. In a case where the content of the filler is 90 mass % or less, since the biting (trapping) of the filler into the connection portion can be suppressed, connection reliability tends to be further improved. From the same viewpoint, the content of the filler may be 40 to 80 mass %.

In the example of FIG. 4, since the area of the main surface of the rewiring portion 6 is larger than the area of the main surface of the sealing layer 5, when the rewiring structure 60 is connected to the sealing structure 50, the rewiring portion 6 has the protruding portion 6E protruding to the outside from the end portion 50E of the sealing structure 50. In addition, the bump 63 may be disposed in the position of the protruding portion 6E, on the main surface 6S of the rewiring portion 6 on the sealing structure 50 side. The protruding portion 6E is a portion protruding to the outside from the end portion 50E of the sealing structure 50 when the sealing structure 50 is seen from a thickness direction X of the connected body 80, in the rewiring portion 6.

As illustrated in FIG. 4($k$), the conductive shield film 23 covering the portion not in contact with the insulating adhesive layer 70 on the outer surface of the sealing structure 50 connected to the rewiring structure 60 is formed. Here, the shield film 23 also covers the portion protruding to the outside from the end portion 50E of the sealing structure 50 on the main surface 6S of the rewiring portion 6, that is, the portion of the protruding portion 6E. Accordingly, the shield film 23 is connected to the bump 63 disposed on the rewiring portion 6 in the position of the protruding portion 6E.

The shield film 23 is mainly provided in order to shield an electromagnetic wave. The shield film 23 can be a single-layer or multi-layer metal thin film, which can be formed, for example, by a method such as sputtering or vapor deposition. The shield film 23 may be formed by using the same conductor precursor as that of the conductive pattern 21.

Figure 5:
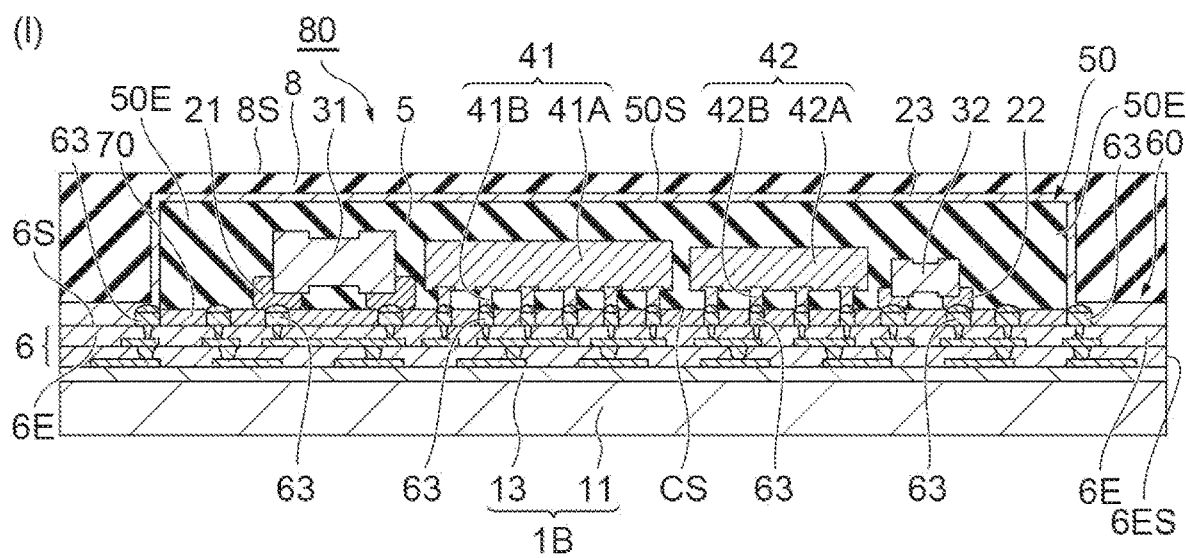
FIG. 5 is a process drawing illustrating an embodiment of a method for manufacturing an electronic component device.
Figure 5:
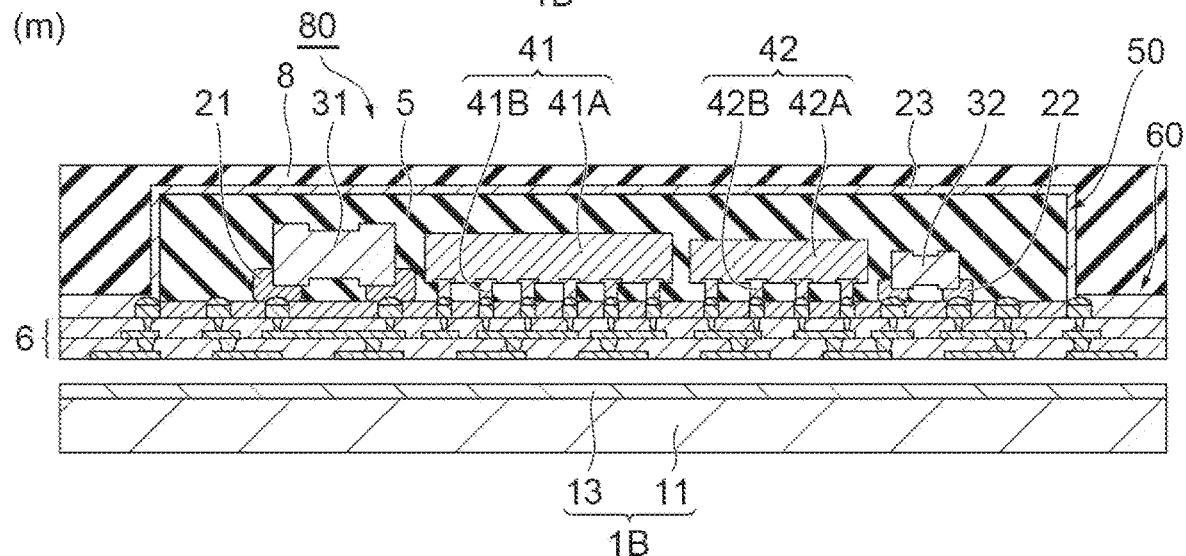
Figure 5:
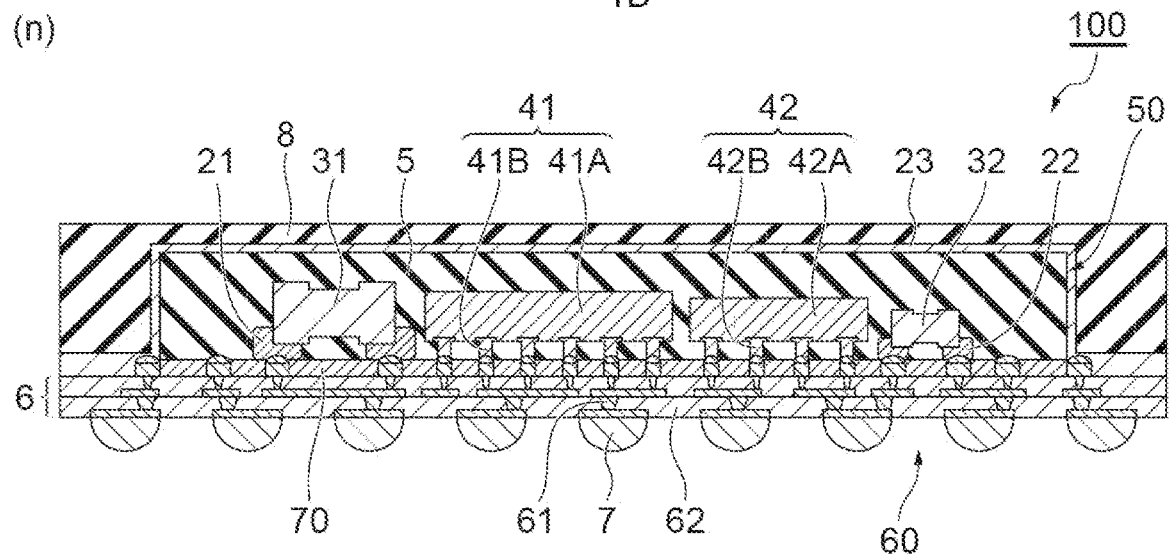

FIG. 5(1) illustrates an example of the step of forming the external sealing layer 8 sealing the sealing structure 50 on the surface of the connected body 80 on the sealing structure 50 side. The external sealing layer 8 extends to a position on the protruding portion 6E from a position on a main surface 50S of the sealing structure 50 on a side opposite to the rewiring structure 60. In the external sealing layer 8, the entire portion positioned on the protruding portion 6E may have a thickness greater than the thickness of the sealing structure 50. Here, the thickness of the external sealing layer 8 indicates the thickness of the sealing structure 50 in the thickness direction. The external sealing layer 8 may have a flat main surface 8S extending to the position on the protruding portion 6E from the position on the main surface 50S of the sealing structure 50 on a side opposite to the rewiring structure 60. The external sealing layer 8 can be formed by the same sealing material and the same formation method as those of the sealing layer 5.

The external sealing layer 8 may extend to the position of an end surface 6ES of the rewiring portion 6 (or the protruding portion 6E). In a case where the plurality of rewiring structures 60 are formed on one carrier base material 1B, the rewiring portions 6 of the plurality of rewiring structures 60 are formed continuously with each other, the external sealing layer 8 may be continuously formed to cover the plurality of rewiring structures 60 while filling a gap between the adjacent rewiring structures 60. In such a case, when the connected body is finally divided into individual electronic component devices, an electronic component device including a flat end surface not including the protruding portion can be particularly easily obtained.

FIG. 5($m$) illustrates an example of the step of peeling off the carrier base material 1B from the rewiring structure 60 connected to the sealing structure 50. The temporary fixing material layer 13 of the carrier base material 1B, for example, can be peeled off from the rewiring portion 6 by heating, light irradiation, or mechanical peeling.

The carrier base material 1B can be heated to a temperature higher than or equal to the melting point of the bump 63 (for example, in a case where the bump 63 contains lead-free solder, typically, 250° C. or higher) in order to connect the sealing structure 50 and the rewiring structure 60, and then, can be easily peeled off from the rewiring structure 60. Accordingly, the temporary fixing material layer, for example, can be peeled off by light irradiation, and examples thereof include a temporary fixing material layer containing a polybenzooxazole resin or a polybenzoimidazole resin (for example, refer to Japanese Unexamined Patent Publication No. 2018-22763), and a temporary fixing material layer containing a polyimide resin (for example, refer to Japanese Unexamined Patent Publication No. 2020-50734). Alternatively, the temporary fixing material layer can be peeled off by mechanical peeling, and examples thereof include a single carbon layer (for example, refer to Japanese Patent No. 47544022), and a composite layer including a carbon layer and a metal layer (for example, refer to Japanese Patent No. 4726855 and Japanese Patent No. 6546526).

As illustrated in FIG. 5(n), a solder ball 7 to be connected to the rewiring 61 may be provided on the main surface of the rewiring portion 6 on a side opposite to the sealing structure 50, after the carrier base material 1B is peeled off. The solder ball 7 can be used as a connection terminal for secondary mounting. As necessary, reflow is performed.

According to the method exemplified above, an electronic component device 100 is obtained. The electronic component device 100 mainly has the sealing structure 50, the rewiring structure 60, the insulating adhesive layer 70 for bonding the sealing structure 50 and the rewiring structure 60 by being interposed therebetween, and the external sealing layer 8 sealing the sealing structure 50.

The method for manufacturing an electronic component device is not limited to the example described above, and can be changed as necessary. For example, a rewiring portion corresponding to a plurality of electronic component devices may be formed on one carrier base material having a large area, and a sealing structure that is separately prepared may be adhesively joined thereto. In such a case, a plurality of sealing structures may be formed on one composite carrier base material, the plurality of sealing structures and a plurality of rewiring portions may be connected at once, and the obtained connected body may be divided into individual electronic component devices.

EXAMPLES

Hereinafter, Examples will be described in which an electronic component device is prepared by applying the method according to one embodiment of the present invention. However, the present invention is not limited thereto.

1. Adhesive Film 60 parts by mass of ethoxylated isocyanuric triacrylate (A-9300, manufactured by SHIN-NAKAMURA CHEMICAL Co., Ltd.), 15 parts by mass of a silica filler (SE2050, manufactured by Admatechs Company Limited, Average Particle Diameter: 0.5 µm), 15 parts by mass of a silica filler surface-treated with epoxy silane (SE2050SEJ, manufactured by Admatechs Company Limited, Average Particle Diameter: 0.5 µm), 30 parts by mass of a nanosilica filler surface-treated with methacryl (YA050CSM, manufactured by Admatechs Company Limited, Average Particle Diameter: approximately 50 nm), and 10 parts by mass of a resin filler (EXL-2655: core-shell type organic fine particles, manufactured by Rohm and Haas Japan K.K.) were added to methyl ethyl ketone as a solvent to obtain a mixed liquid in which the total concentration of the components except for the solvent was 60 mass %. The mixed liquid was stirred with a bead mill (a planetary fine pulverizer P-7, manufactured by Fritsch Japan Co., Ltd.) for 30 minutes while adding beads. After that, 60 parts by mass of a phenoxy resin (ZX1356, manufactured by Tohto Kasei Co., Ltd., Tg: approximately 71° C., Weight Average Molecular Weight: approximately 63000)) was added to the mixed liquid, and the mixed liquid was stirred again with the bead mill for 30 minutes. Subsequently, the mixed liquid was further stirred after adding 2 parts by mass of a dicumyl peroxide (PERCUMYL D, manufactured by NOF CORPORATION). The beads were removed from the mixed liquid after stirring by filtration to obtain a varnish. The obtained varnish was applied onto a support film, and a coated film was dried to form an adhesive film having a thickness of 20 µm.

2. Preparation of Sealing Structure

A carrier base material ("HRDP", manufactured by Mitsui Mining & Smelting Co., Ltd., a width of 12 inches, a thickness of 1.1 mm) including a glass plate as a support, and a temporary fixing material layer (a peeling layer) formed on the glass plate was prepared. A photosensitive resin film ("RD1215", manufactured by Hitachi Chemical Co., Ltd., a thickness of 15 µm) was laminated on the temporary fixing material layer of the carrier base material, and was exposed in a predetermined pattern and developed to form an alignment mark for positioning a passive component and a semiconductor chip. Next, the adhesive film described above was laminated on the temporary fixing material layer to form an adhesive layer. A conductive paste ("SP-1000", manufactured by Hitachi Chemical Co., Ltd.) was printed on the adhesive layer to form a pad as a precursor of a connection portion for mounting the passive component, having a thickness of 60 µm. A resistor component ("ERJXGN0R00Y", manufactured by Panasonic Corporation) of 0Ω, having a size of W 0.4 mm×D 0.2 mm×H 0.13 mm, and a resistor component ("ERJ1GN0R00C", manufactured by Panasonic Corporation) of 0Ω, having a size of W 0.6 mm×D 0.3 mm×H 0.23 mm, were mounted on the pad, as the passive component. Next, 256 chip components ("CC80", manufactured by WALTS CO., LTD.) that had a size of W 7.3 mm×D 7.3 mm×H 0.2 mm and included a copper bump having a height of 40 µm, as the connection portion, was disposed in a predetermined position on the adhesive layer. The obtained structure was heated at 175° C. for 2 hours in an oven for curing the adhesive layer, and then, was heated in a reflow furnace at the highest temperature of 265° C. for forming the connection portion by curing the conductive paste. Subsequently, a sealing layer having a thickness of 0.5 mm for sealing the passive component and the chip component on the adhesive layer was formed by a compression mold using a solid sealing material ("CEL-400ZHF40-F1G", manufactured by Hitachi Chemical Co., Ltd.). The carrier base material was peeled off from the adhesive layer, and the adhesive layer was ground until a circuit surface to which the connection portion of the passive component and the semiconductor chip was exposed was formed to form a sealing structure. A die shift amount (a shift from a design value of a mounting position) in the obtained sealing structure was 2.7 µm in an X direction, and 1.6 µm in a Y direction, on average of 256 chip components.

3. Preparation of Rewiring Structure

A rewiring layer having a two-layer configuration including a copper pad provided on a surface layer portion was formed by a method including forming an insulating layer on the temporary fixing material layer of the same carrier base material as that used for preparing the sealing structure by exposing and developing a photosensitive insulating resin ("AH3000", manufactured by Hitachi Chemical Co., Ltd.), and forming rewiring by copper sputtering and plating. Copper plating (a height of 10 μm) and tin-silver solder plating (a height of 15 μm) were formed on the copper pad of the rewiring layer in this order to form a bump.

4. Connection between Sealing Structure and Rewiring Structure

An insulating adhesive layer ("AK1220", manufactured by Hitachi Chemical Co., Ltd.) was laminated on the circuit surface of the sealing structure. The sealing structure was cut by a dicing saw along with the insulating adhesive layer, and the sealing structure having a size of 15.2 mm×13.2 mm was cut out. The sealing structure was preliminarily connected to a predetermined position of the rewiring structure by a flip chip bonder in a condition of a temperature of 120° C. and a pressurization time for 2 seconds. An external sealing layer that had a thickness of 0.7 mm and covered the sealing structure preliminarily connected to the rewiring structure was formed by a compression mold using a solid sealing material ("CEL-400ZHF40-W5MG", manufactured by Hitachi Chemical Co., Ltd.). Subsequently, the connection portion of the electronic component and the semiconductor chip and the bump of the rewiring structure were joined by heating in a reflow furnace at the highest temperature of 265° C. Finally, the carrier base material was peeled off from the rewiring structure connected to the sealing structure by mechanical peeling to obtain an electronic component device including the sealing structure and the rewiring structure.

REFERENCE SIGNS LIST

1A: composite carrier base material, 1B: carrier base material, 5: sealing layer, 6: rewiring portion, 6E: protruding portion, 6S: main surface of rewiring portion, 6ES: end surface of rewiring portion, 7: solder ball, 8: external sealing layer, 8S: main surface of external sealing layer, 11: support, 13: temporary fixing material layer, 15: adhesive layer, 21, 22: conductive pattern (connection portion), 23: shield film, 31, 32: passive component (electronic component), 41A, 42A: IC chip (electronic component), 41B, 42B: bump (connection portion) of IC chip, 50: sealing structure, 50E: end portion of sealing structure, 50S: main surface of sealing structure, 60: rewiring structure, 61: rewiring, 62: insulating layer, 63: bump, 70: insulating adhesive layer, 80: connected body, 100: electronic component device, CS: circuit surface.

The invention claimed is:

1. A method for manufacturing an electronic component device, the method comprising:
preparing a sealing structure comprising a sealing layer having two opposing main surfaces, an electronic component sealed in the sealing layer, and a connection portion connected to the electronic component, the connection portion being exposed on a circuit surface that is one main surface of the sealing layer;
preparing a rewiring structure comprising a rewiring portion having two opposing main surfaces, and a plurality of bumps provided on one main surface of the rewiring portion, the rewiring portion comprising rewiring connected to the plurality of bumps, and an insulating layer, wherein preparing the rewiring structure includes:
preparing a carrier base material comprising a support and a temporary fixing material layer provided on the support;
forming the rewiring portion on the temporary fixing material layer; and
forming the plurality of bumps connected to the rewiring on the main surface of the rewiring portion on a side opposite to the carrier base material; and then
bonding the sealing structure and the rewiring structure in a direction that the circuit surface and at least a part of the plurality of bumps face each other, with an insulating adhesive layer intervening between the sealing structure and the rewiring structure, such that the connection portion and at least a part of the plurality of bumps are connected, thereby forming a connected body comprising the sealing structure and the rewiring structure, the rewiring portion of the rewiring structure connected to the sealing structure comprising a protruding portion protruding to an outside from an end portion of the sealing structure;
forming an external sealing layer sealing the sealing structure on a surface of the connected body on a sealing structure side, the external sealing layer extending to a position on the protruding portion from a position on one of the main surfaces of the sealing structure on a side opposite to the rewiring structure; and
peeling off the carrier base material from the rewiring structure connected to the sealing structure.

2. The method according to claim 1,
wherein a part of the plurality of bumps is formed on the rewiring portion in a position to be the protruding portion when the rewiring structure is connected to the sealing structure.

3. The method according to claim 2, further comprising:
forming a conductive shield film covering a portion not in contact with the insulating adhesive layer on an outer surface of the sealing structure connected to the rewiring structure, and a surface of the protruding portion,
wherein the shield film is connected to the bump disposed on the rewiring portion in the position of the protruding portion, and
the external sealing layer is formed so as to cover the shield film.

4. The method according to claim 1, further comprising:
forming a conductive shield film covering a portion of an outer surface of the sealing structure not in contact with the insulating adhesive layer, and a surface of the protruding portion,
wherein the external sealing layer is formed so as to cover the shield film.

5. The method according to claim 1,
wherein the sealing structure includes a plurality of electronic components, and the plurality of electronic components comprise an IC chip and a chip type passive component.

6. The method according to claim 1,
wherein by bonding the sealing structure and the rewiring structure the insulating adhesive layer completely fills a gap between the sealing structure and the rewiring structure except at where the connection portion and the least a part of the plurality of bumps are connected.

7. The method according to claim 1,
wherein the insulating adhesive layer and the external sealing layer are made of different materials.

8. A method for manufacturing an electronic component device, the method comprising:
preparing a sealing structure comprising a sealing layer having two opposing main surfaces, an electronic component sealed in the sealing layer, and a connection portion connected to the electronic component, the connection portion being exposed on a circuit surface that is one main surface of the sealing layer;

preparing a rewiring structure comprising a rewiring portion having two opposing main surfaces, and a plurality of bumps provided on one main surface of the rewiring portion, the rewiring portion comprising rewiring connected to the plurality of bumps, and an insulating layer, wherein preparing the sealing structure, includes:

preparing a composite carrier base material including a support, a temporary fixing material layer, and a curable adhesive layer, which are laminated in this order;

disposing the electronic component on the adhesive layer of the composite carrier base material, with interposing the connection portion in contact with the adhesive layer between the adhesive layer and the electronic component;

fixing the electronic component to the composite carrier base material by curing the adhesive layer;

forming the sealing layer sealing the electronic component on the adhesive layer;

curing the sealing layer;

obtaining the sealing structure comprising the adhesive layer, the electronic component, and the sealing layer by peeling off the temporary fixing material layer from the adhesive layer; and forming the circuit surface on which the connection portion is exposed by grinding the sealing structure from the adhesive layer side, in this order; and bonding the sealing structure and the rewiring structure in a direction that the circuit surface and at least a part of the plurality of bumps face each other, with an insulating adhesive layer intervening between the sealing structure and the rewiring structure, such that the connection portion and at least a part of the plurality of bumps are connected, thereby forming a connected body comprising the sealing structure and the rewiring structure, the rewiring portion of the rewiring structure connected to the sealing structure comprising a protruding portion protruding to an outside from an end portion of the sealing structure; and forming an external sealing layer sealing the sealing structure on a surface of the connected body on a sealing structure side, the external sealing layer extending to a position on the protruding portion from a position on one of the main surfaces of the sealing structure on a side opposite to the rewiring structure.

9. A method for manufacturing an electronic component device, the method comprising:

preparing a sealing structure comprising a sealing layer having two opposing main surfaces, an electronic component sealed in the sealing layer, and a connection portion connected to the electronic component, the connection portion being exposed on a circuit surface that is one main surface of the sealing layer;

preparing a rewiring structure comprising a rewiring portion having two opposing main surfaces, and a plurality of bumps provided on one main surface of the rewiring portion, the rewiring portion comprising rewiring connected to the plurality of bumps, and an insulating layer; and then bonding the sealing structure and the rewiring structure in a direction that the circuit surface and at least a part of the plurality of bumps face each other, with an insulating adhesive layer intervening between the sealing structure and the rewiring structure, such that the connection portion and at least a part of the plurality of bumps are connected, thereby forming a connected body comprising the sealing structure and the rewiring structure, the rewiring portion of the rewiring structure connected to the sealing structure comprising a protruding portion protruding to an outside from an end portion of the sealing structure, wherein forming the connected body includes:

preliminarily connecting the sealing structure and the rewiring structure such that the connection portion and at least a part of the plurality of bumps are in contact with each other by pressurizing the sealing structure and the rewiring structure, with the insulating adhesive layer intervening, while heating at a temperature lower than a melting point of the bump; and joining the connection portion and at least a part of the plurality of bumps, by heating the sealing structure and the rewiring structure at a temperature higher than the melting point of the bump, in this order; and forming an external sealing layer sealing the sealing structure on a surface of the connected body on a sealing structure side, the external sealing layer extending to a position on the protruding portion from a position on one of the main surfaces of the sealing structure on a side opposite to the rewiring structure.

10. The method according to claim 9, wherein the external sealing layer is formed after the sealing structure and the rewiring structure are preliminarily connected, and then, the connection portion and at least a part of the plurality of bumps are joined.

* * * * *